US008729584B2

(12) United States Patent
Bhattacharya et al.

(10) Patent No.: US 8,729,584 B2

(45) Date of Patent: May 20, 2014

(54) LIGHTING SYSTEM

(75) Inventors: Rabin Bhattacharya, Silver Spring, MD (US); Koen Van Os, Eindhoven (NL); Hugo J. Cornelissen, Waalre (NL)

(73) Assignee: Koninklijke Philips N.V., Eindhoven (NL)

( * ) Notice: Subject to any disclaimer, the term of this patent is extended or adjusted under 35 U.S.C. 154(b) by 224 days.

(21) Appl. No.: 13/133,401

(22) PCT Filed: Dec. 3, 2009

(86) PCT No.: PCT/IB2009/055475

§ 371 (c)(1),
(2), (4) Date: Jun. 8, 2011

(87) PCT Pub. No.: WO2010/067271

PCT Pub. Date: Jun. 17, 2010

(65) Prior Publication Data

US 2011/0241052 A1 Oct. 6, 2011

(30) Foreign Application Priority Data

Dec. 9, 2008 (EP) .................................... 08171070

(51) Int. Cl.
*H01L 33/00* (2010.01)

(52) U.S. Cl.
USPC .................................... 257/98; 257/E33.055

(58) Field of Classification Search
USPC ............ 257/98, E33.055; 362/511, 556, 555, 362/551, 231
See application file for complete search history.

(56) References Cited

U.S. PATENT DOCUMENTS

| | | | | |
|---|---|---|---|---|
| 4,642,736 | A | 2/1987 | Masuzawa et al. | |
| 5,372,756 | A | 12/1994 | Oyama | |
| 6,072,619 | A * | 6/2000 | Kiryuschev et al. | 359/245 |
| 6,963,085 | B2 * | 11/2005 | Chou | 257/88 |
| 7,090,386 | B2 * | 8/2006 | Coushaine et al. | 362/555 |
| 7,189,983 | B2 * | 3/2007 | Aguirre et al. | 250/504 R |
| 7,831,115 | B2 * | 11/2010 | Bchir et al. | 385/14 |
| 8,134,132 | B2 * | 3/2012 | Middlemass et al. | 250/455.11 |
| 8,208,502 | B2 * | 6/2012 | Srinivasan et al. | 372/6 |
| 8,215,788 | B2 * | 7/2012 | Van Herpen | 362/153 |
| 2003/0026585 | A1 * | 2/2003 | Iimura | 385/144 |
| 2004/0190851 | A1 * | 9/2004 | Garner et al. | 385/137 |
| 2004/0238834 | A1 * | 12/2004 | Yasuoka et al. | 257/88 |
| 2005/0116179 | A1 * | 6/2005 | Aguirre et al. | 250/492.1 |
| 2006/0257095 | A1 * | 11/2006 | Walt et al. | 385/147 |
| 2007/0092185 | A1 * | 4/2007 | Sasaki | 385/89 |
| 2007/0189697 | A1 * | 8/2007 | Oguma | 385/137 |

(Continued)

FOREIGN PATENT DOCUMENTS

| | | | |
|---|---|---|---|
| WO | 03083529 | A1 | 10/2003 |
| WO | 2004100111 | A2 | 11/2004 |

(Continued)

*Primary Examiner* — Daniel Luke
*Assistant Examiner* — Latanya N Crawford
(74) *Attorney, Agent, or Firm* — Mark L. Beloborodov

(57) ABSTRACT

The present invention relates to a light emitting device (1) comprising a light emitter (10) and a support (13) to which a plurality of protruding fibers (11) are attached. The light emitter (10) and the protruding fibers (11) are arranged to interact with light emitted from the light emitter (10) so that the light may be diffused. The plurality of protruding fibers comprises fibers (11) which are inclined or perpendicular in relation to the support (13).

17 Claims, 5 Drawing Sheets

(56) References Cited

U.S. PATENT DOCUMENTS

| | | | | |
|---|---|---|---|---|
| 2007/0279367 | A1* | 12/2007 | Kitai | 345/102 |
| 2008/0135863 | A1* | 6/2008 | Onobuchi | 257/98 |
| 2008/0205035 | A1* | 8/2008 | Asvadi et al. | 362/103 |
| 2008/0248278 | A1* | 10/2008 | Fisher et al. | 428/304.4 |
| 2009/0310922 | A1* | 12/2009 | Sasaki | 385/89 |
| 2010/0085753 | A1* | 4/2010 | Van Pieterson et al. | 362/249.02 |
| 2011/0241052 | A1* | 10/2011 | Bhattacharya et al. | 257/98 |
| 2012/0327654 | A1* | 12/2012 | Bhattacharya et al. | 362/235 |

FOREIGN PATENT DOCUMENTS

| | | | |
|---|---|---|---|
| WO | 2006014230 | A2 | 2/2006 |
| WO | 2006129246 | A1 | 12/2006 |
| WO | 2007141726 | A1 | 12/2007 |

* cited by examiner

LIGHTING SYSTEM

FIELD OF THE INVENTION

The invention relates to the field of light emitting devices, and more specifically to an improvement of the material characteristics of the diffusing element or elements.

BACKGROUND OF THE INVENTION

Light emitting diode (LED) lighting devices with a low resolution, that is with the LED's spaced apart so the individual LED spots can easily be distinguished, may be used in many different applications such as pictures, text and graphics in connection with, for example, textiles such as garments. However the fact that the individual LED's are visible can disturb the viewing of the pictures, text or graphics. The solution to this problem is to add a diffusive layer on top of the LED thus spreading the light to a larger area. This diffusive layer can be made of different materials such as woven or non-woven materials, flexible foams, or some combination thereof.

An example of this can be seen in US2008/0205035A1. Here LED's are placed under a diffusive layer comprising a layer of non-woven fabric having a lower density at a side facing the lighting unit and a higher density at a side opposite to the lighting unit. The lower density layer provides spacing in order for light cone from the light units to spread, before encountering the denser portion of the diffusive element.

SUMMARY OF THE INVENTION

It is an object of the present invention to provide a light emitting device that is more flexible and thinner than the solutions presently known.

The object is fulfilled by providing a light emitting device comprising a light emitter, a support and a plurality of protruding fibers attached to the support, the plurality of protruding fibers being arranged to interact with light emitted from the light emitter, wherein each fiber of the plurality of protruding fibers protrudes at an angle with the support, the angle being in a range of 10 degrees to 170. The fibers provide a thinner and more flexible solution. More light emitters may also be present. The light emitter may be a light emitting diode. The interaction between the light and the protruding fibers may comprise reflection of the light or the light may pass through the fibers. The fibers may be a part of the support, if e.g. the support is woven in such a way that the fibers are protruding from the surface. The protruding fibers create a three dimensional scattering structure, where the light may be scattered and/or shadowed in the air gap and by the fibers. The angle where the fibers are attached between the fiber and the support is at an angle greater than 0 degrees and less than 180 degrees, preferably the angle is in an interval between 5 degrees and 175 degrees, most preferably in an interval between 10 degrees and 170 degrees. All of the fibers do not have to have the same angle to the support, and they are not parallel to the support. The fibers may be placed in such a way that they surround the one or more light emitters. This structure allows for overall thinner diffusion structures to be fabricated in order to achieve the same results as equivalent thicker structures. With the thinner optical structure, the overall system can be engineered to also be more flexible.

According to an embodiment of the invention each fiber of the plurality of protruding fibers protrudes substantially perpendicular to the support. This means that the protruding fibers do not interact with light emitted from at least one direction, which may be light emitted from the top of the light emitter and this creates a different light effect. According to an embodiment of the invention the plurality of protruding fibers are substantially transparent, which may mean that 90% or more of the emitted light is conveyed through the fiber. This makes it possible for the light to propagate through the fibers, diffusing the light more because the light is not only scattered upwards/downwards, but also propagates in-plane as well.

According to an embodiment of the invention the light emitting device may further comprise a substrate. The substrate may be contributing to diffusing or reflecting the light depending on the type of material used and where it is located. The substrate may be located below the support, if e.g. the support is made of a transparent material. An example of this can be seen in FIG. 6 where a substrate (not shown) may be placed below a layer of e.g. silicone. The layer construction would then be a substrate where upon one or more light emitters are attached. A layer of a transparent material is then e.g. poured over the substrate and the light emitters. In this layer fibers that may scatter the light is attached. Here a substrate of a reflective material such as a material comprising $TiO_2$ or a metallic or mirror like surface may provide reflection, contributing to the scattering of the light so the light is not absorbed. The substrate may be located opposite the support. An example of this can be seen in FIGS. 5 and 8. Here the fibers are located between the substrate and the support, the fibers pointing in the general direction of the substrate. Here materials with a diffusing characteristic for the support may be more useful. This could be a textile or non woven material or foam that is placed opposite the support and the light emitter and may provide the light emitting device with a smoother surface or may contribute to creating light effects, such as regulate the amount of light that escapes through the surface of the substrate or create coloring effects, if e.g. the substrate is colored.

According to an embodiment of the invention the support is placed in connection with the light emitter. The support may be located below the light emitter, where the support may be a fabric. The support may also be placed on top of the light emitter and between the light emitters if more are present, where the support advantageously is transparent and it may also be flexible. Silicone or a similar material may be used for this purpose, providing a support for the fibers to attach to.

According to an embodiment of the invention, the substrate is substantially parallel to the support, the plurality of protruding fibers being provided to a surface of the support facing the substrate, and the light emitter being provided on a surface of the substrate facing the support. In other words, the light emitter is located across from the support and the fibers attached thereto. With the wording substantially parallel is meant that angle between the substrate and the support is a maximum of 10 degrees.

According to an embodiment of the invention the plurality of protruding fibers is light reflecting. This contributes to the diffusing of the light, and for the light to propagate in-plane. The light may encounter several fibers before it leaves the structure.

According to an embodiment of the invention the plurality of protruding fibers are selected from a group consisting of Velcro, polymeric fibers, glass fiber, optical fibers, carbon fibers, metal fibers, ribbons, composite and any combination thereof.

With a variety of materials it may be possible to create a variety of effects, and different materials may be more appropriate to certain applications. The fibers cross section may be circular, but fibers may have other shapes such as thin narrow ribbons, like a fiber that has been squeezed flat a bit, or triangular, square, star shaped or any other shape. Basically anything with translational symmetry, to maximize in-plane scattering and minimize out-of-plane scattering may be applied.

According to an embodiment of the invention the plurality of protruding fibers are randomly distributed. This provides a more natural, random, non-engineered non-patterned look.

According to an embodiment of the invention the plurality of protruding fibers are arranged in a pattern. By arranging the protruding fibers or lateral structures in a pattern, it is possible to create specifically desired light effects.

According to an embodiment of the invention the support or the substrate is substantially reflective. This means that light is not absorbed and thus less light is lost. Normally this would be placed at that same side and/or in connection with the light emitter. The substrate may be conductive as well.

According to an embodiment of the invention the support or said substrate is substantially diffusive. In this way the light may be diffused and scattered out and different light effects may be obtained depending on the degree of diffusion. By substantially diffusive is meant that the light is isotropic and/or is not strongly directional.

According to an embodiment of the invention the support is selected from a group consisting of a mesh, woven fibers, non woven fibers, silicone, polymer, ceramic material, composite, glass, glue and any combination thereof.

This means that depending on what the light emitting device is to be used for, the appropriate material(s) may be selected.

According to an embodiment of the invention the light emitting device is attached to a textile. Because the structure is so flexible and thin and because of its textile like feel to it, the device can be used in garments or other application in e.g. interior decoration for cushions or the like.

Even though the word light emitter is used through out the text, it is to be construed as at least one light emitter or light emitting diode. The same applies to the support, which is defined as the material the fibers are attached to. Here several supports may also be present, even though only one may be mentioned. In this way fibers may be coming from several sides and cross each other, thus contributing to creating light effects.

All the features of the support may also apply to the substrate such as the location of the substrate in relation to the light emitter or fibers or the materials from which it is made.

The fibers can be manufactured in a common textile way such as weaving, shaving, flogging (surface roughening of a fabric), etc. An example of a product made in this way is Velcro.

It is noted that the invention relates to all possible combinations of features recited in the claims.

BRIEF DESCRIPTION OF THE DRAWINGS

This and other aspects of the present invention will now be described in more detail, with reference to the appended drawings showing currently preferred embodiments of the invention. Like numbers refer to like features throughout the drawings.

DETAILED DESCRIPTION OF THE EMBODIMENTS

Figure 1:
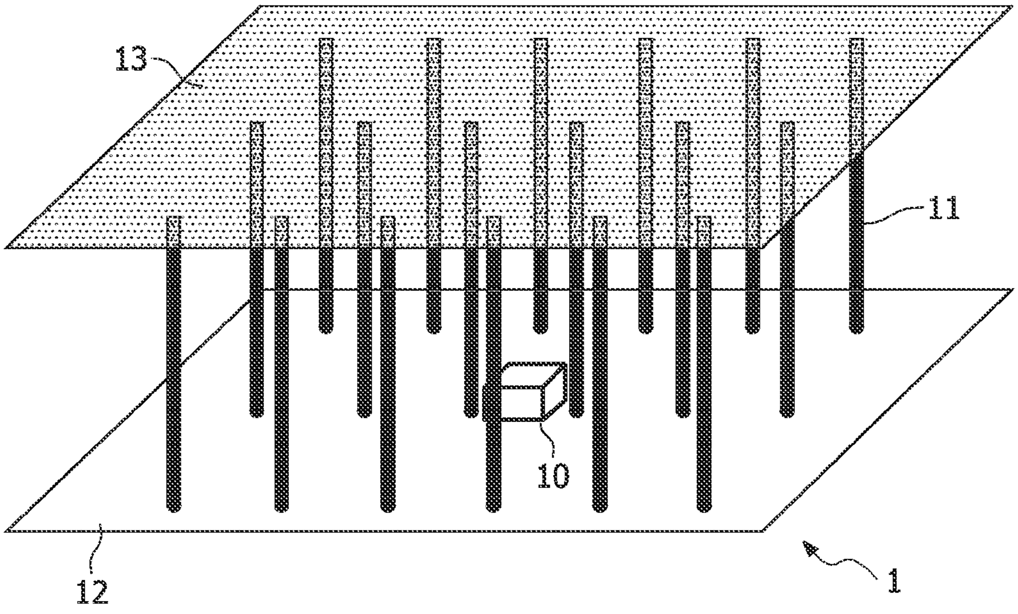
FIG. 1 shows a schematic three dimensional view of an embodiment of the present invention.
Figure 2:
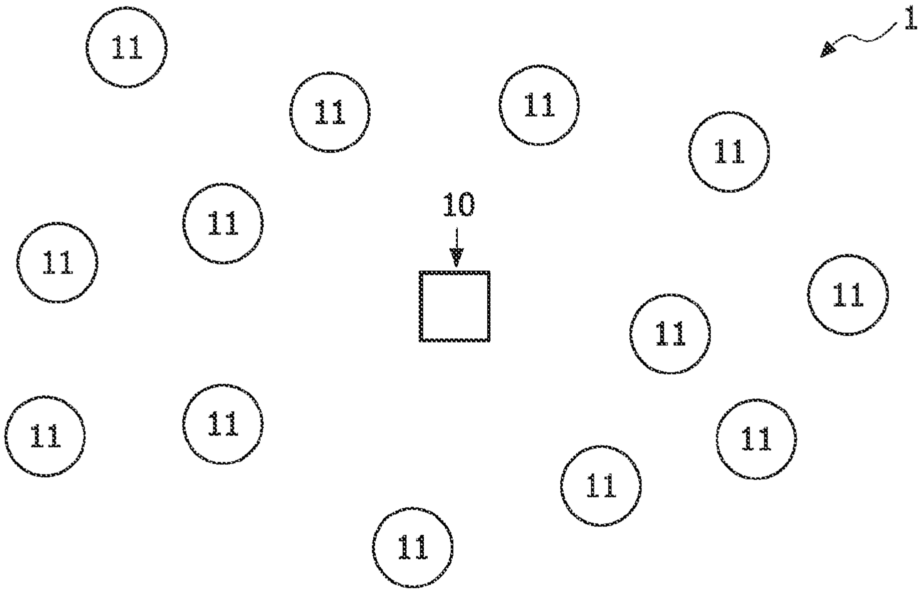
FIG. 2 shows a cross sectional top view of another embodiment of the present invention.

FIG. 1 shows a schematic three dimensional view of an embodiment of the light emitting device 1. A lighting source or light emitter 10 is mounted to a substrate 12 and is surrounded by a plurality of fibers 11. Finally a support 13 is placed above the fibers 11. The fibers may be pre-attached to the support 13, and the support 13 may function as a diffusing layer as well. In this figure, the fibers 11 are shown in a periodic distribution with respect to each other, however, they can also be distributed in a random pattern with respect to each other as can be seen in FIG. 2. The substrate 12 should preferably be made from a material that is as reflective as possible in order to prevent light that is scattered backwards to be lost through absorption of the material. It should be noted that even though the substrate 12 and the support 13 are placed at the bottom and at the top respectively, it may also be that the fibers are attached to the substrate, and thus the substrate serves the purpose of being a support as well. The fibers 11 may be attached by means of glue, silicone or other transparent, semitransparent or materials containing reflective elements, if attached to the substrate 12, in order to maintain the reflective qualities of the substrate 12. If attached to the support 13, the fibers might be a part of the support, if this is e.g. a fabric, for example produced by flogging. The fibers 11 can either have a periodic distribution or may be completely random with respect to each other's location. The fibers 11 can be made of many different types of materials, though transparent or reflective materials are the preferred optical materials. Light rays can either be reflected from the fibers and/or pass through them (if they are made of transparent or semitransparent materials). Moreover, these fibers 11 may cast a shadow or the light may pass around or through them, thus creating light effects.

FIG. 2 shows a cross sectional top view of another embodiment of the present invention. Here the fibers 11 are distributed randomly with respect to each other. The light emitter, 10, is located in the middle of these lateral structures for illustrative purposes.

Figure 3:
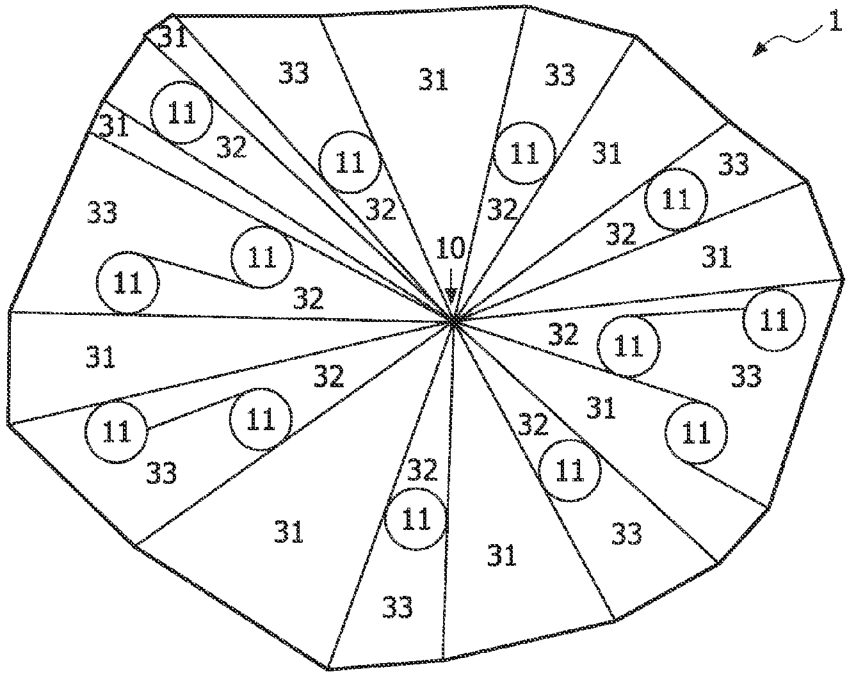
FIG. 3 shows a cross sectional top view of the embodiment as depicted in FIG. 2, but with regions of light rays.

FIG. 3 shows the same construction found in FIG. 2 except with regions defined on and around the fibers 11. These regions correspond to the effects of light that is emitted from the light emitter 10. Some of the light rays emitted from the light emitter 10 can pass undisturbed 31 while others may either scatter or partially scatter 32 off of the fibers 11. Finally, light cast a complete or partial shadow 33 behind the fibers 11.

Figure 4:
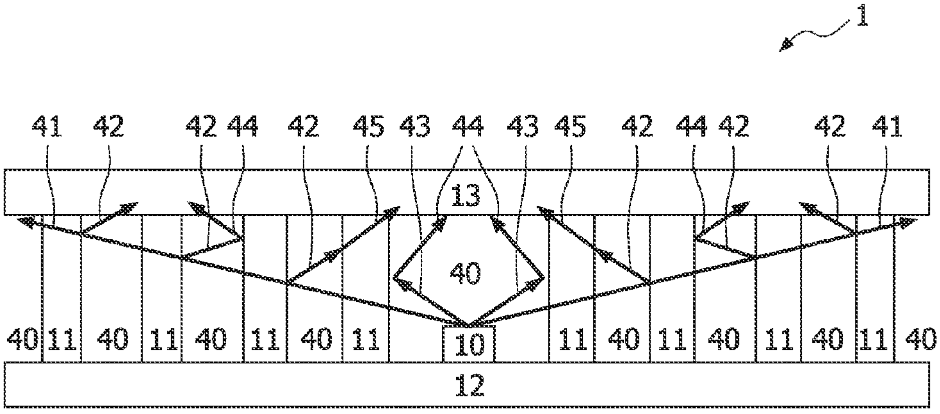
FIG. 4 shows a horizontal cross-sectional side view showing different light rays propagating from a light emitter.

FIG. 4 shows a horizontal cross-sectional side view of FIG. 1 showing different light rays propagating from a light emitter. Because of the fibers 11, an air gap 40 is formed between the substrate 12 and the support 13. This air gap 40 helps further diffuse the light due to light's propagation through it. Once the light reaches the support 13, it can then further diffuse based on the optical characteristics of the support 13. Light rays 41, can pass undisturbed through the air gaps, or light rays 42 pass through some of the fibers 11 and then reflect to the support 13, or light rays 43 immediately be reflected at the first fiber 11 encountered. Once a light ray 44 has been reflected, the light ray 44 can either reflect off of an adjacent fiber 11 or the light ray 45 can continue past adjacent fibers 11. The light rays may continue to propagate in-plane and they are not scattered upward/downward as in conventional diffusers like foams. This promotes the lateral spreading of the light. Diffusers that are directionally anisotropic and redistribute light predominantly in-plane may be used.

Figure 5:
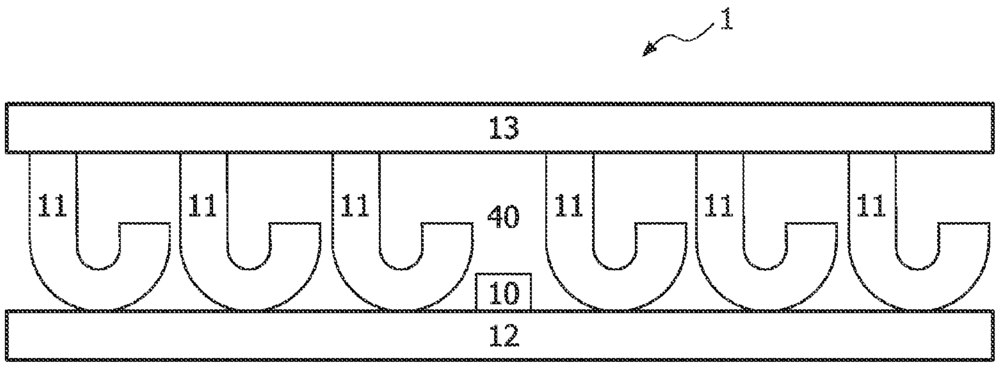
FIG. 5 shows a schematic drawing of an embodiment of how the fibers behave when pressed downwards, the fibers being attached substantially perpendicular to the support.

FIG. 5 shows a schematic drawing of an embodiment of how the fibers behave when pressed downwards. If the optical layers 11, 13, 40 are pushed further down and the fibers 11 are compressed and the light becomes more diffuse. FIG. 5 shows that the compression causes the density of scattering points or fibers 11 to increase while still maintaining an air gap 40 in the system. This scattering density becomes larger because the fibers 11 bend when they are pushed downwards on top of the light emitter(s) 10. The bend causes the density of lateral scattering points in a plane to increase because the bent fibers 11 will work as two (or more) fibers. The fibers may split but the fibers 11 may also just bend and create a higher density. The substrate 12 or the support 13 may also be a textile or a photonic textile.

Figure 6:
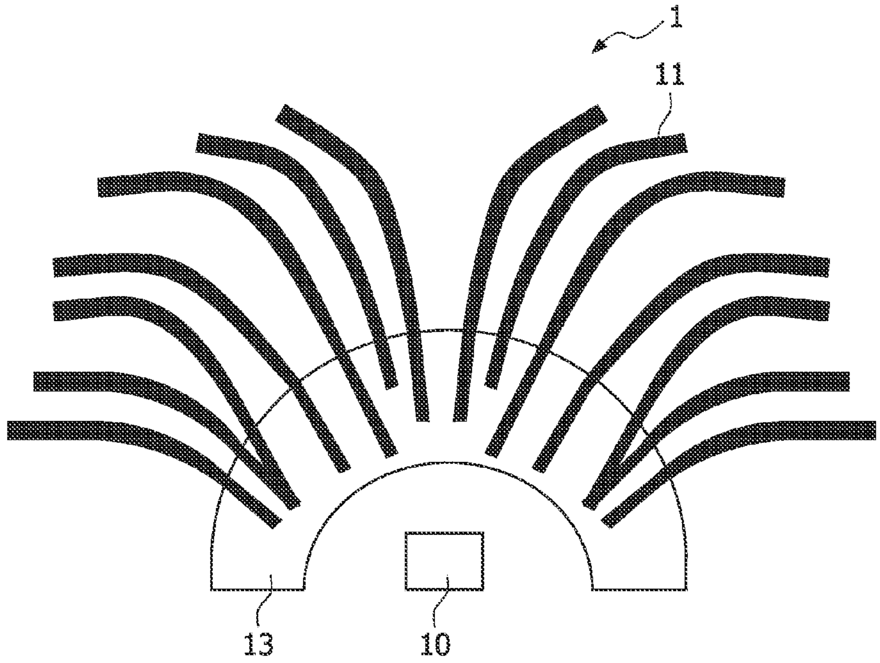
FIG. 6 shows a schematic drawing of an embodiment of an optical dome with fibers that are protruding from it.

FIG. 6 shows a schematic drawing of an embodiment of an optical dome, here being the support 13, with fibers 11 that are protruding from it.

Fibers 11 can be molded into the top or bottom of a support 13 that is molded over a light emitter 10. For instance, if a silicone dome is molded over a light emitter 10 on a textile substrate 12 (not shown), fibers 11 may be molded on top of this structure. The dome may be transparent and may contain light scattering particles. The dome may also be encapsulating the light emitter, so that there is no air gap between the light emitter 10 and the support 13.

Figure 7:
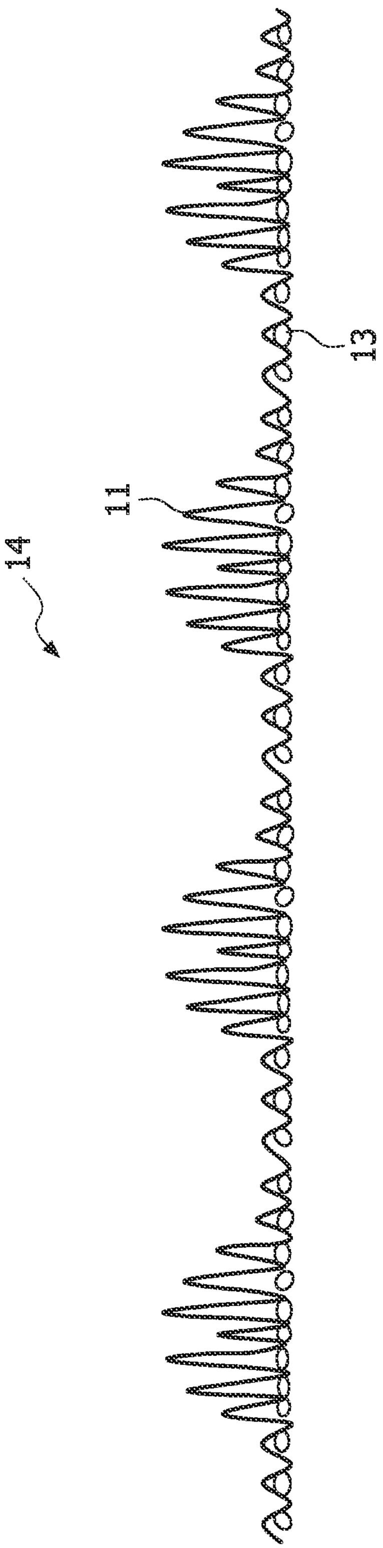
FIG. 7 shows a schematic drawing of an embodiment of a woven scattering structure.

FIG. 7 shows a schematic drawing of an embodiment of a woven scattering structure 14. The structure may be construed as a support 13 and the fibers 11 combined in one structure. Weaving technology can be used in order to alter the height and spacing of the fibers 11 in a weave, thereby helping making the fibers 11 have regular shapes and distributions. This method can be relatively cheap, reproducible and tailor made to LED displays. In a similar way, a woven surface can be roughened, or shaved, in order to produce protruding fibers to create patterned diffusion structures.

Figure 8:
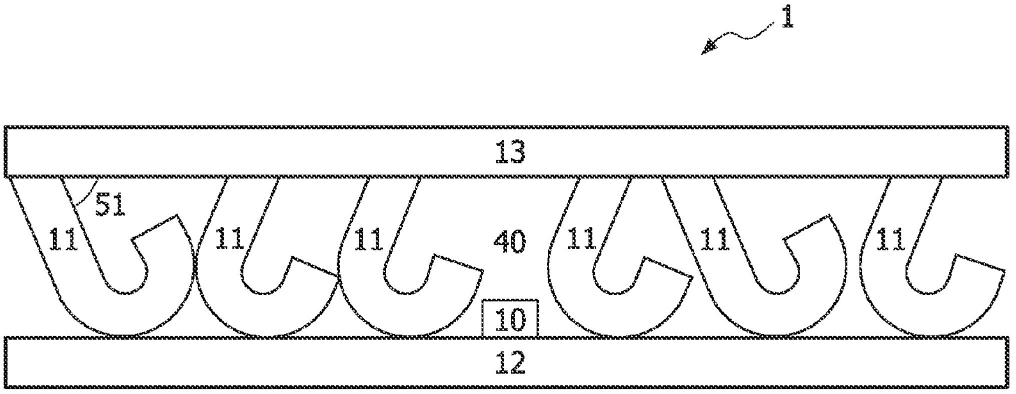
FIG. 8 shows a schematic drawing of an embodiment of how the fibers behave when pressed downwards, the fibers being attached at an angle between 10 to 170 degrees to the support.

FIG. 8 shows a schematic drawing of an embodiment of how the fibers 11 behave when pressed downwards, the fibers being attached at an angle between 10 to 170 degrees to the support 13. The angle 51 between the fibers 11 and the support 13 may be different for the individual fibers 11. The fibers 11 may also be attached to the substrate 12.

While the invention has been illustrated and described in detail in the drawings and foregoing description, such illustration and description are to be considered illustrative or exemplary and not restrictive; the invention is not limited to the disclosed embodiments. Variations to the disclosed embodiments can be understood and effected by those skilled in the art in practicing the claimed invention, from a study of the drawings, the disclosure, and the appended claims. In the claims, the word "comprising" does not exclude other elements, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A light emitting device, comprising:

a light emitter, a support, a substrate, and a plurality of protruding fibers attached to the support, the plurality of protruding fibers being arranged to interact with light emitted from the light emitter to promote scattering of the light by the fibers and in air gaps therebetween, wherein each fiber of the plurality of protruding fibers protrudes at an angle with the support, the angle being in a range of 10 degrees to 170 degrees, wherein the substrate is substantially parallel to the support, the plurality of protruding fibers being provided to a su face of the support facing the substrate, and the light emitter being provided on a surface of the substrate facing the support.

2. A light emitting device according to claim 1, wherein each fiber of the plurality of protruding fibers protrudes substantially perpendicular to the support.

3. A light emitting device according to claim 1, wherein the plurality of protruding fibers are substantially transparent.

4. A light emitting device according to claim 1, wherein the support is placed in connection with the light emitter.

5. A light emitting device according to claim 1, wherein the plurality of protruding fibers are light reflective.

6. A light emitting device according to claim 1, wherein the plurality of protruding fibers are selected from a group consisting of Velcro, polymeric fibers, glass fibers, optical fibers, carbon fibers, metal fibers, ribbons, composite and any combination thereof.

7. A light emitting device according to claim 1, wherein the plurality of protruding fibers are randomly distributed.

8. A light emitting device according to claim 1, wherein the plurality of protruding fibers are arranged in a pattern.

9. A light emitting device according to claim 1, wherein the support or the substrate is substantially reflective.

10. A light emitting device according to claim 1, wherein the support or the substrate is substantially diffusive.

11. A light emitting device according to claim 1, wherein the support is selected from a group consisting of a mesh, woven fibers, non-woven fibers, silicone, polymer, ceramic material, composite, glass, glue and any combination thereof.

12. A light emitting device according to claim 1, wherein the light emitting device is attached to a textile.

13. A light emitting device according to claim 1, wherein the light emitter is a light-emitting diode.

14. A light emitting device, comprising:

a light emitter disposed on a reflective substrate and comprising at least one light-emitting diode, and a three-dimensional scattering structure, comprising a plurality of fibers arranged to protrude towards and substantially surround the light emitter for scattering and/or shadowing light emitted from the light emitter, wherein the plurality of fibers are attached to a support disposed substantially parallel to the substrate, such that the plurality of fibers are provided on a surface of the support facing the substrate, and the light emitter is provided on a surface of the substrate facing the support.

15. A light emitting device according to claim 14, wherein the plurality of fibers are reflective or transparent.

16. A light emitting device according to claim 14, wherein the plurality of fibers protrude at an angle with the support, the angle being in a range of 10 degrees to 170 degrees.

17. A light emitting device according to claim 14, wherein the support is substantially diffusive.

* * * * *